(12) United States Patent
Namioka et al.

(10) Patent No.: US 12,432,951 B2
(45) Date of Patent: Sep. 30, 2025

(54) SEMICONDUCTOR DEVICE AND METHOD OF MANUFACTURING THE SAME

(71) Applicant: RENESAS ELECTRONICS CORPORATION, Tokyo (JP)

(72) Inventors: Seigo Namioka, Tokyo (JP); Hitoshi Matsuura, Tokyo (JP); Ryota Kuroda, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 413 days.

(21) Appl. No.: 18/179,739

(22) Filed: Mar. 7, 2023

(65) Prior Publication Data

US 2023/0420550 A1 Dec. 28, 2023

(30) Foreign Application Priority Data

Jun. 28, 2022 (JP) ................................ 2022-103090

(51) Int. Cl.
*H10D 12/00* (2025.01)
*H10D 12/01* (2025.01)
*H10D 62/10* (2025.01)
*H10D 62/17* (2025.01)
*H10D 64/23* (2025.01)

(52) U.S. Cl.
CPC ......... *H10D 12/481* (2025.01); *H10D 12/035* (2025.01); *H10D 12/038* (2025.01); *H10D 62/127* (2025.01); *H10D 62/393* (2025.01); *H10D 64/231* (2025.01)

(58) Field of Classification Search
CPC .. H10D 62/393; H10D 12/441; H10D 12/461; H10D 12/481; H10D 12/491; H10D 12/411; H10D 12/415; H10D 12/416; H10D 12/417; H10D 12/418; H10D 12/421; H10D 12/038; H10D 12/035; H10D 12/032; H10D 12/031
See application file for complete search history.

(56) References Cited

U.S. PATENT DOCUMENTS

| 10,505,029 | B2 | 12/2019 | Nagata | |
|---|---|---|---|---|
| 2017/0278956 | A1* | 9/2017 | Tsuyuki | ............... H10D 12/461 |
| 2020/0212209 | A1* | 7/2020 | Nagata | ................. H10D 12/038 |

FOREIGN PATENT DOCUMENTS

JP 2019-029434 A 2/2019

* cited by examiner

*Primary Examiner* — Eric A. Ward
(74) *Attorney, Agent, or Firm* — Rimon P.C.

(57) ABSTRACT

A semiconductor device includes a trench emitter electrode located at a boundary between one end of an active cell region and an inactive cell region, a trench gate electrode located at a boundary between the other end of the active cell region and the inactive cell region, an end trench gate electrode connected to one end of the trench gate electrode, and an end trench emitter electrode connected to one end of the trench emitter electrode. A hole barrier region of a first conductivity type is provided under a body region of a second conductivity type between the end trench gate electrode and the end trench emitter electrode in a plan view. A body region in the active cell region and a body region in the inactive cell region are connected to each other by a body region between the end trench gate electrode and the end trench emitter electrode.

8 Claims, 15 Drawing Sheets

SEMICONDUCTOR DEVICE AND METHOD OF MANUFACTURING THE SAME

CROSS-REFERENCE TO RELATED APPLICATIONS

The disclosure of Japanese Patent Application No. 2022-103090 filed on Jun. 28, 2022, including the specification, drawings and abstract is incorporated herein by reference in its entirety.

BACKGROUND OF THE INVENTION

The present disclosure relates to a semiconductor device, and is applicable to, for example, IE(Injection Enhancement) type trench IGBT.

A trench gate IGBT is widely used as IGBT(Insulated Gate Bipolar Transistor) of lower collector-emitter saturation VCE(sat). In order to further promote conductivity modulation, IE type trench gate IGBT utilizing IE effect has been developed.

In this IE trench gate IGBT, active cells actually connected to emitter electrodes and inactive cells having a P-type floating region are alternately arranged in a cell region. As a result, holes are easily accumulated on a device main surface side (emitter side) of a semiconductor substrate. In this type of IE type trench gate IGBT, holes injected from a collector side are prevented from escaping to the emitter side by the inactive cell region, so that the concentration of holes between the active cell region and the collector side is increased. As the concentration of the holes increases, an injection of electrons from the emitter (source) side is promoted, and the concentration of the electrons also increases. In this way, higher carrier density by IE effect allows conductivity modulations to occur and lower VCE (sat).

Further, IE type trench gate IGBT includes a GE-S type IGBT including two trenches having potentials differing from each other in a trench (G) connected to a gate potential and a trench (E) connected to an emitter potential. The GE-S type IGBT is disclosed by, for example, Japanese unexamined Patent Application publication No. 2019-29434. In this GE-S type IGBT, isolation between a P-type floating region and a P-type body region which is formed in an active cell region and supplied with a potential, cannot be physically separated by using the trenches, so electric isolation is performed by using a high-concentration N-type layer at a cell end portion.

SUMMARY OF THE INVENTION

In the technique disclosed in Japanese unexamined Patent Application publication No. 2019-29434, a horizontal N-channel MOSFET(Metal Oxide Semiconductor Field Effect Transistor) having the above-described high-concentration N-type layer as a drain is formed. This MOSFET is hereinafter simply referred to as a parasitic NMOS. In addition, when an insulating film containing phosphorus (P) such as a PSG(Phosphorus silicate Glass) film is used as an interlayer insulating film, phosphorus, which is an N-type impurity, may leach out to a surface of a channel region of the parasitic NMOS. Therefore, the effective channel-impurity concentration of the parasitic NMOS is lowered, and the parasitic NMOS conducts (ON state) to form a current path in some cases. Consequently, ID-VG property is deteriorated.

Other objects and novel features will become apparent from the description of this specification and the accompanying drawings.

The typical ones of the present disclosure will be briefly described as follows. That is, a semiconductor device includes a trench emitter electrode located at a boundary between one end of an active cell region and an inactive cell region, a trench gate electrode located at a boundary between the other end of the active cell region and the inactive cell region, an end trench gate electrode connected to the one end of the trench gate electrode, and an end trench emitter electrode connected to one end of the trench emitter electrode.

Between the end trench gate electrode and the end trench emitter electrode, a hole barrier region of a first conductivity type is provided under a body region of a second conductivity type. A body region in the active cell region and a body region in the inactive cell region are connected by a body region between the end trench gate electrode and the end trench emitter electrode.

According to the above-described semiconductor device, ID-VG property can be improved.

DETAILED DESCRIPTION

Figure 1:
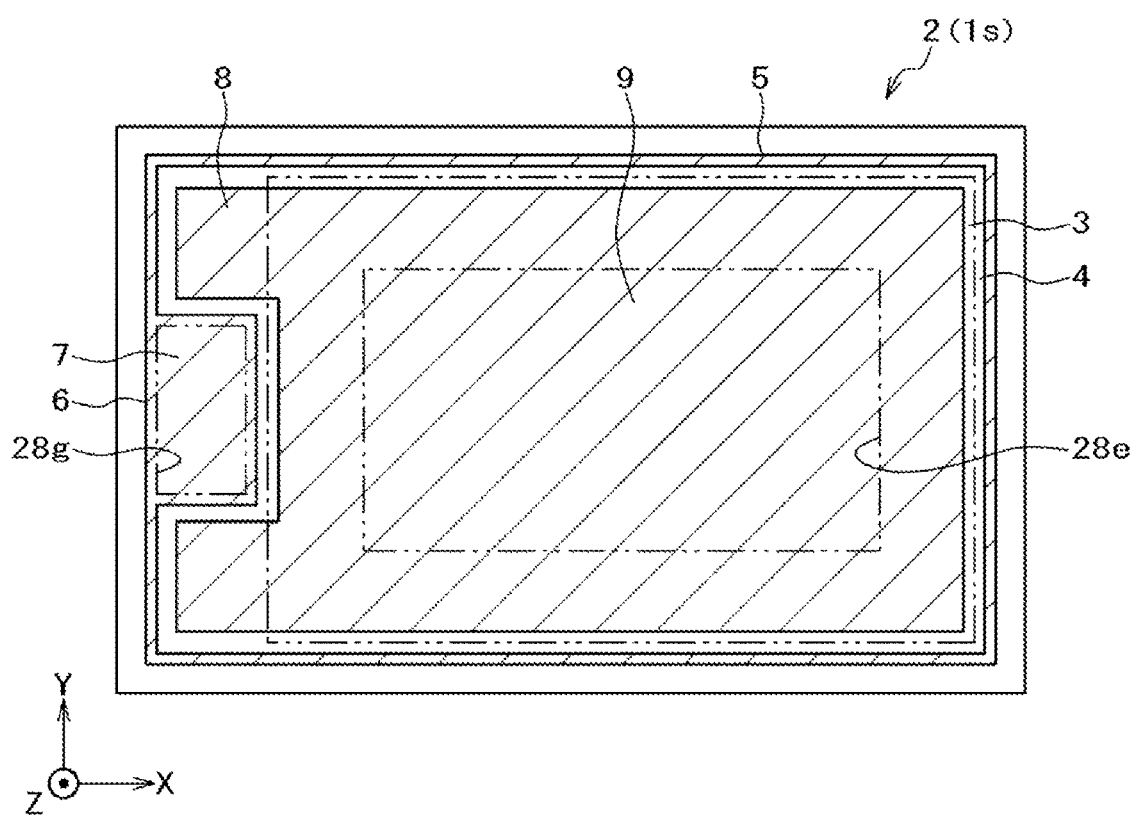
FIG. 1 is a top view of a semiconductor device according to an embodiment.

Embodiments, modified examples, and comparative examples will be described below with reference to the drawings. However, in the following description, the same components are denoted by the same reference numerals, and repeated description thereof may be omitted. It should be noted that, for clarity of explanation, the drawings may be schematically represented with respect to widths, thicknesses, shapes, and the like of the respective portions as compared with actual embodiments. Also, the dimensional relationships of the respective elements, the ratios of the respective elements, and the like do not necessarily coincide with each other in the plurality of drawings.

A configuration of a semiconductor device (semiconductor chip) according to the embodiment will be described with reference to FIG. 1. FIG. 1 is a top view of a semiconductor device according to an embodiment. In FIG. 1, for simplicity of understanding, the insulating film 28 (refer to FIG. 3) is removed and seen through, and the outer peripheries of the cell formation region 3, the emitter pad 9, and the gate pad 7 are indicated by two-dot chain lines. The semiconductor device shown in FIG. 1 is a GE-S type IGBT.

The semiconductor device 2 in the embodiment has a semiconductor substrate is. The semiconductor substrate is has an upper surface serving as one main surface and a rear surface serving as the other main surface facing away from the upper surface. Further, the semiconductor substrate is includes a cell forming region 3 as a region of a part of the surface, and a gate wiring lead-out region 4 as a region of another part of the surface. The gate wiring lead-out region 4 is provided, for example, on the outer periphery of the semiconductor-substrate is with respect to the cell forming region 3.

An emitter electrode 8 is provided in the cell formation region 3. A central portion of the emitter electrode 8 serves as an emitter pad 9 for connecting a bonding wire or the like. The emitter pad 9 is composed of a part of the emitter electrode 8 exposed from an opening 28e formed in an insulating film 28 (refer to FIG. 3) formed so as to cover the emitter electrode 8. The emitter electrode 8 is formed of, for example, a metal film mainly composed of aluminum.

The gate wiring 5 and the gate electrode 6 are provided in the gate wiring lead-out region 4. The gate wiring 5 is provided on the outer periphery of the semiconductor substrate is, for example, with respect to the emitter-electrode 8. The gate wiring 5 is connected to the gate electrode 6. A central portion of the gate electrode 6 serves as a gate pad 7 for connecting a bonding wire or the like. The gate pad 7 is composed of a part of the gate electrode 6 exposed from the opening 28g formed in the insulating film 28 (refer to FIG. 3) formed so as to cover the gate electrode 6. The gate wiring 5 and the gate electrode 6 are made of, for example, a metal film mainly composed of aluminum.

Figure 2:
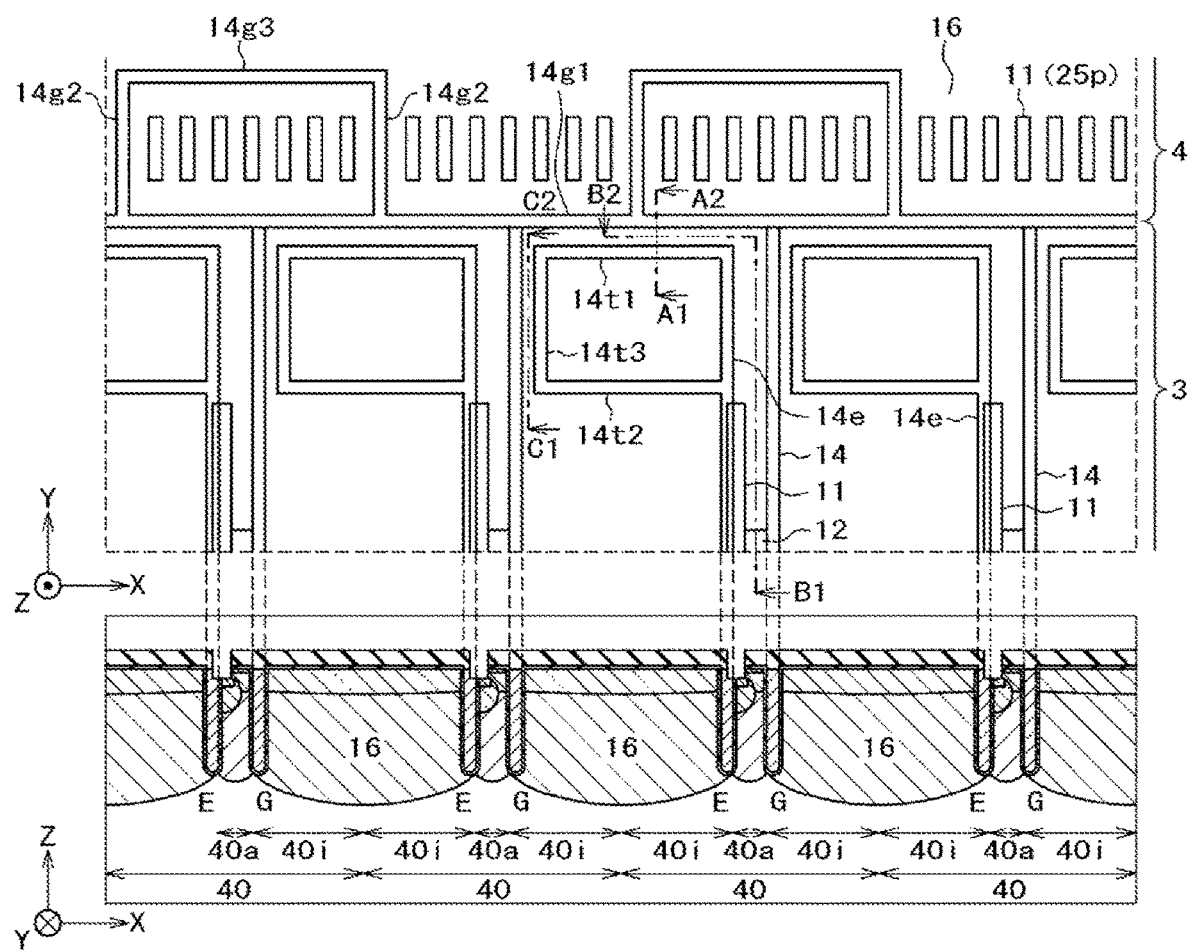
FIG. 2 is a plan view showing a cell formation region and a gate wiring lead-out region and a cross-sectional view of the cell formation region, of the semiconductor device shown in FIG. 1.
Figure 3:
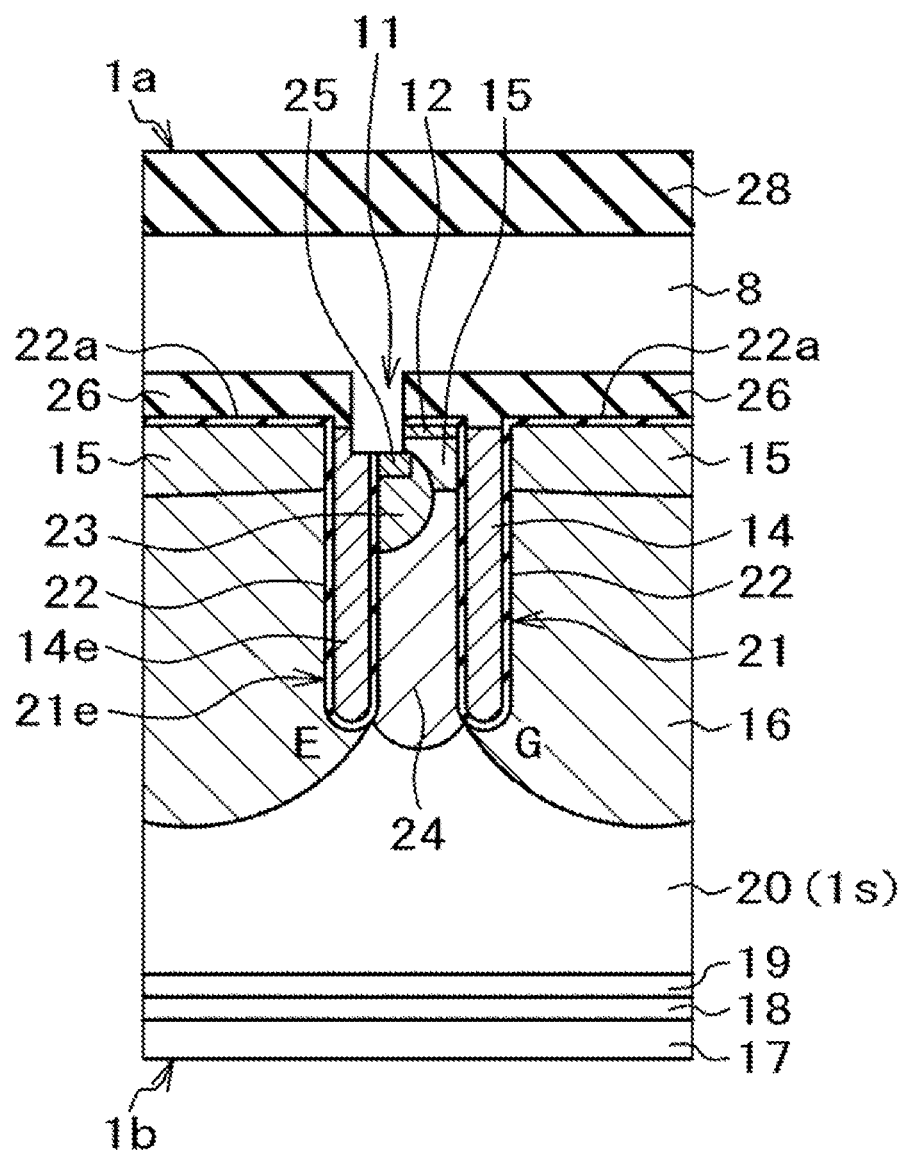
FIG. 3 is a cross-sectional view of the cell formation region shown in FIG. 2.
Figure 4:
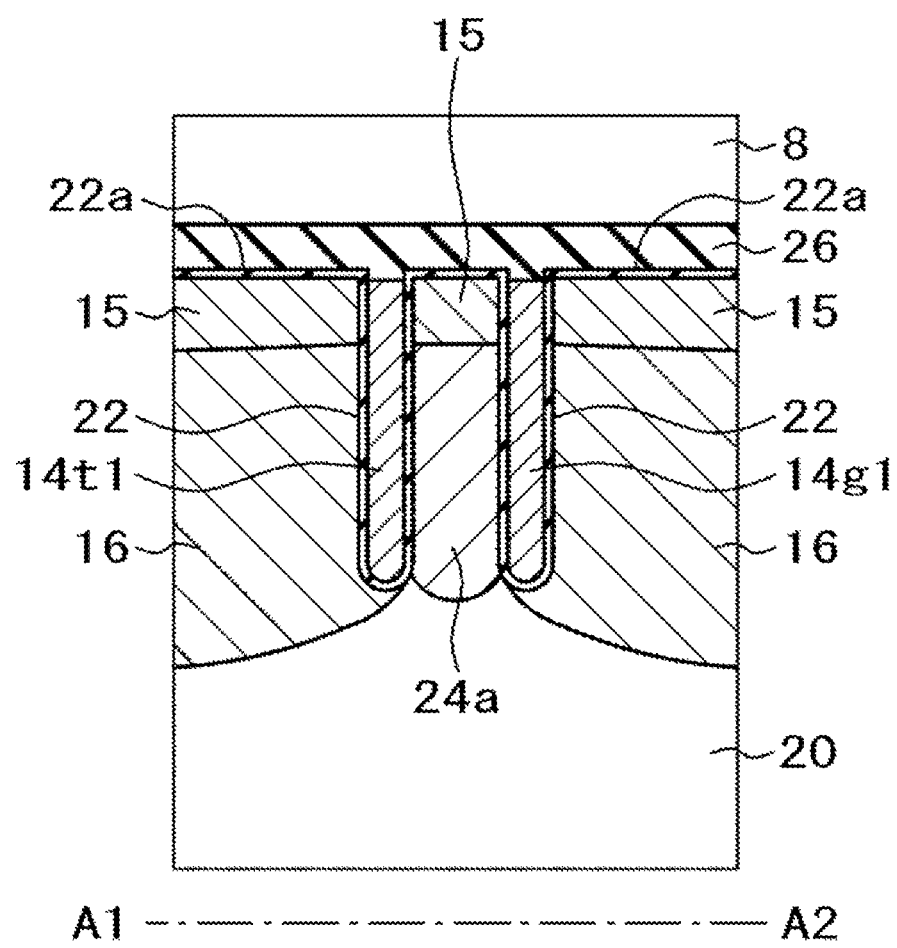
FIG. 4 is a A1-A2 line cross-sectional view of the semiconductor device shown in FIG. 2.

The configuration of the cell formation region of the semiconductor device 2 will be described with reference to FIGS. 2 and 3. FIG. 2 is a plan view showing a cell formation region and a gate wiring lead-out region and a cross-sectional view of the cell formation region, of the semiconductor device shown in FIG. 1. FIG. 3 is a cross-sectional view of the cell formation region shown in FIG. 2. FIG. 4 is a cross-sectional view of the semiconductor device shown in FIG. 2 taken along a A1-A2 line. FIG. 3 is a cross-sectional view similar to the cross-sectional view of FIG. 2. Note that FIG. 2 shows a state in which the insulating film 28, the emitter electrode 8, and the interlayer insulating film 26 shown in FIG. 3 are removed and viewed in perspective in order to simplify understanding.

As shown in FIG. 2, two directions crossing each other in the surface of the semiconductor substrate is, preferably orthogonal to each other, are X direction and Y direction, and a direction perpendicular to the surface of the semiconductor substrate is, that is, the up-down direction is Z direction. At this time, as shown in FIG. 2, a plurality of active cell regions 40a and a plurality of inactive cell regions 40i are provided in the cell forming region 3. The plurality of active cell regions 40a extend in the Y direction and are periodically arranged in the X direction in a plan view. In other words, the active cell regions 40a are formed in a longitudinal stripe-like shape. The plurality of inactive cell regions 40i extend in the Y direction and are periodically arranged in the X direction in a plan view. The active cell regions 40a and the inactive cell regions 40i are alternately arranged in the X direction. An unit cell region 40 is composed of one of active cell regions 40a, a half region of the inactive cell region 40i adjacent to an one side of the one of the active cell regions 40a, and a half region of the inactive cell region 40i adjacent to the other side of the one of active cell regions 40a.

In the present specification, the term "in a plan view" means a view perpendicular to the upper surface of the semiconductor substrate is.

In the active cell area 40a, a trench gate electrode 14 and a trench emitter electrode 14e are provided. The trench gate electrode 14 and the trench emitter electrode 14e extend in the Y direction in a plan view. The trench gate electrode 14 and the trench emitter electrode 14e are provided on both sides in the X direction with a P-type body region 15 and an N-type hole barrier region 24 interposed therebetween. The trench gate electrode 14 is electrically connected to the gate electrode 6, and the trench emitter electrode 14e is electrically connected to the emitter electrode 8. The N-type hole barrier region 24 is provided deeper than the P-type body region 15.

In the active cell region 40a, a plurality of N+-type emitter regions 12 are provided in the P-type body region 15 on the upper surface side of the semiconductor-substrate is. The P-type body region 15 is a semiconductor region of a P-type conductivity type, and the N+-type emitter region 12 is a semiconductor region of an N-type conductivity type different from the P-type conductivity type. In the active cell region 40a, the P-type body region 15 is continuously formed along the Y direction in a plan view. In the active cell region 40a, the plurality of N+-type emitter regions 12 are arranged at regular intervals along the Y direction. This structure makes it possible to reduce an emitter width (S).

In the present specification, meaning that "the conductivity type of a semiconductor is P-type" is that "only holes are charge carriers, or both electrons and holes may be charge carriers, but the concentration of holes is higher than the concentration of electrons, and holes are the main charge carriers". In addition, in the present specification, meanings that "the conductivity type of a semiconductor is N-type" is that "only the electrons are charge carriers, or both the electrons and the holes may be charge carriers, but the concentration of the electrons is higher than the concentration of the holes and the electrons are the main charge carriers".

In the inactive cell region 40i, a P-type body region 15 is provided between the trench gate electrode 14 and the trench emitter electrode 14e adjacent to each other. Further, a P-type floating region 16 is provided deeper than the P-type body region 15.

Further, in the embodiment illustrated in FIG. 2, the width (Ws) of the active cell region 40a in the X direction is narrower than the width (Wi) of the inactive cell region 40i in the X direction (Wa<Wi). In such a case, IE effectiveness of IGBT can be enhanced.

In the gate wiring lead-out region 4, there is a portion where, for example, a P-type floating region 16 is provided so as to surround the cell formation region 3. The P-type floating region 16 is electrically connected to the emitter electrode 8 via a P+-type body contact region 25 in a portion exposed on the bottom surface of a contact groove 11.

Further, a gate wiring 5 is arranged in the gate wiring lead-out region 4, and a trench gate electrode 14 extends from the inside of the cell formation region 3 toward the gate wiring 5. In the gate wiring lead-out area 4, end portions of two trench gate electrodes 14 adjacent to each other are connected to each other by an end trench gate electrode 14$g$1. An end trench gate electrode 14$g$2 extending in the Y direction from the end trench gate electrode 14$g$1 is provided, and end portions of two adjacent end trench gate electrodes 14$g$2 are connected to each other by an end trench gate electrode 14$g$3. The end trench gate electrodes 14$g$3 are arranged in regions where the gate wires 5 are arranged in a plan view. The end trench gate electrode 14$g$3 is electrically connected to the gate wire 5.

The trench gate electrode 14 and the trench emitter electrode 14$e$ are disposed on both sides of the inactive cell region 40$i$ located between two adjacent active cell regions 40$a$ in a plan view.

In the active cell region 40$a$, a P+-type semiconductor region including a P+-type body contact region 25 and a P+-type latch-up prevention region 23 shown in FIG. 3 is continuously formed along the Y direction. In the active cell region 40$a$, a contact groove 11 as an opening is continuously formed in the P-type body region 15 shown in FIG. 3 along the Y direction. The contact groove 11 reaches the P+-type body contact region 25 disposed in the active cell region 40$a$.

Further, in the inactive cell region 40$i$ in the cell forming region 3, end trench emitter electrodes 14$t$1, 14$t$2 extend from the trench emitter electrode 14$e$ in the X direction. The end portions of the end trench emitter electrodes 14$t$1, 14$t$2 are connected to each other by an end trench emitter electrode 14$t$3.

As shown in FIG. 3, a P+-type collector region 18 is provided in a semiconductor region on the rear surface of the semiconductor device 2, and a collector electrode 17 is provided on the surface of P+-type collector region 18. The collector electrode 17 is formed of, for example, a metal film mainly composed of aluminum. An N-type field stop region 19 is provided between an N--type drift region 20 constituting a main part of the semiconductor substrate is and the P+-type collector region 18.

On N--type drift region 20 in the active cell region 40$a$, an N-type hole barrier region 24, a P-type body region 15, and an N+-type emitter region 12 are provided in this order from the bottom. The N+-type emitter region 12 is provided only on the trench gate electrode 14 side. An interlayer insulating film 26 is formed on the trench gate electrode 14, the trench emitter electrode 14$e$, the P-type body region 15, and the N+-type emitter region 12. In a part of the interlayer insulating film 26 in the active cell area 40$a$, a contact groove 11 extending into the trench emitter 14$e$ and the semiconductor substrate 1$s$ is formed. The P+-type body contact region 25 and the P+-type latch-up prevention region 23 are provided in a semiconductor region at the bottom of the contact groove 11 in this order from the top. The P-type body region 15 and the N+-type emitter region 12 are connected to the emitter electrode 8 provided on the interlayer insulating film 26 via the contact groove 11 and the like.

Here, the N-type hole barrier region 24 is a barrier region for preventing holes from flowing into a passage from the N--type drift region 20 to the N+-type emitter region 12. The impurity concentration of the N-type hole barrier region 24 is lower than that of the N+-type emitter region 12 and higher than that of N--type drift region 20. Due to the presence of the N-type hole barrier region 24, holes accumulated in the inactive cell region 40$i$ can be effectively prevented from entering an emitter passage (the passage from N--type drift region 20 toward the P+-type body contact region 25) of the active cell region 40$a$.

On the other hand, in N--type drift region 20 in the inactive cell region 40$i$, a P-type floating region 16 and a P-type body region 15 are provided in this order from the bottom. A depth of the P-type floating region 16 is greater than a depth of the trench 21. The P-type floating region 16 is distributed so as to cover a lower end portion of the trench 21.

Figure 5:
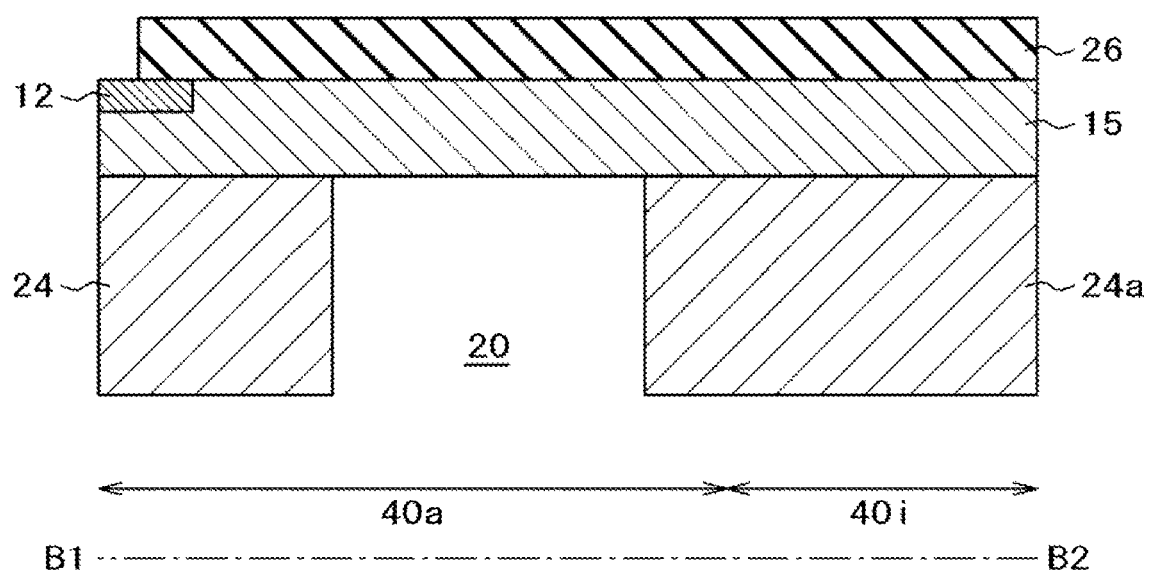
FIG. 5 is a B1-B2 line cross-sectional view of the semiconductor device shown in FIG. 2.
Figure 6:
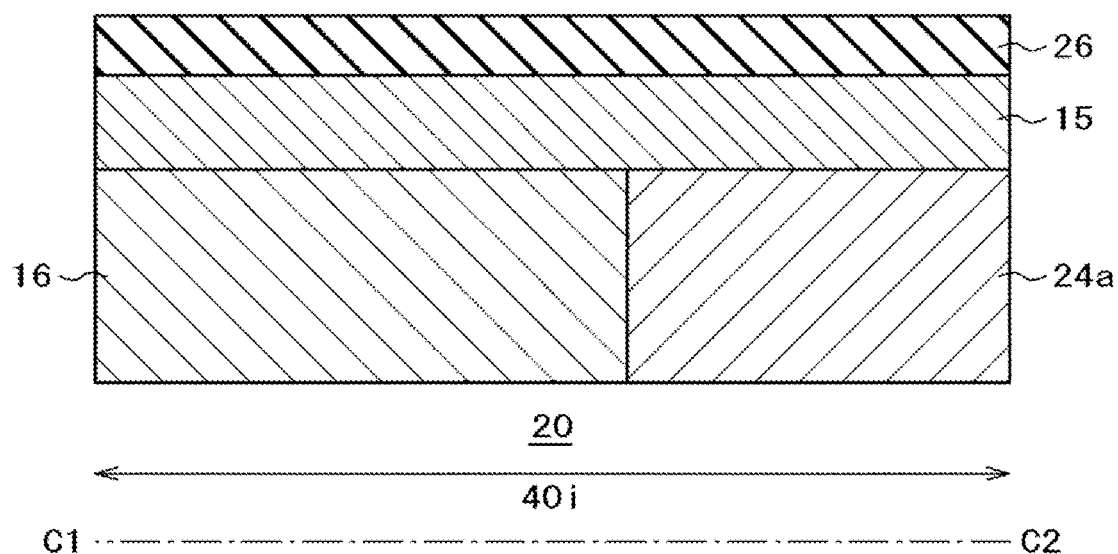
FIG. 6 is a C1-C2 line cross-sectional view of the semiconductor device shown in FIG. 2.

A configuration of an end portion (a region adjacent to the gate wiring lead-out region 4) of the cell formation region 3 will be described with reference to FIGS. 4 to 6. FIG. 4 is a cross-sectional view of the semiconductor device shown in FIG. 2 taken along a A1-A2 line. FIG. 5 is a cross-sectional view of the semiconductor device shown in FIG. 2 taken along a B1-B2 line. FIG. 6 is a cross-sectional view of the device shown in FIG. 2 taken along a C1-C2 line.

Here, since a trench electrode sandwiching a floating region generally has the same potential, the floating region can be separated by surrounding the floating region with the trench electrode. However, GE-S type IGBT is structured such that the P-type floating regions 16 are sandwiched between trench electrodes having differing potentials (i.e., the trench gate electrode 14 and the trench emitter electrode 14$e$). Therefore, the P-type floating region 16 cannot be surrounded by the trench electrode, and it is necessary to separate the P-type floating region 16 by providing a resistance region to a hole between the P-type floating region 16 and the contact groove 11.

For example, as shown in FIG. 4, an N-type hole barrier region 24$a$ formed of a high-concentration N-type layer and a P-type body region 15 are provided between the end trench gate electrode 14$g$1 and the end trench emitter electrode 14$t$1. As a result, the resistor to the holes increases, and a hole barrier effect in the lateral direction (X direction) is obtained. The P-type floating region 16 functions as a floating layer by suppressing hole discharge. The P-type floating region 16 is formed as a deeper P-type diffusion layer covering the trench bottoms of the end trench gate electrode 14$g$1 and the end trench emitter electrode 14$t$1, so that the electric field strength at the trench bottoms does not increase.

It is more preferable that a space between the end trench gate electrode 14$g$1 and the end trench emitter electrode 14$t$1 be as narrow as possible. Alternatively, the length of the end trench emitter electrode 14$t$3 extending in the Y direction is preferably longer. As a result, the resistor to the holes can be further increased, and the separation (hole barrier) effect can be further enhanced. Note that when the resistor to the holes can be secured by the end trench gate electrode 14$g$1 and the end trench emitter electrode 14$t$1, the end trench emitter electrodes 14$t$2,14$t$3 may not be provided.

As shown in FIG. 5, the N--type drift region 20 is provided between the N-type hole barrier region 24$a$ and the N-type hole barrier region 24 formed in the active cell region 40$a$.

As shown in FIG. 6, between the trench gate electrode 14 and the end trench emitter electrode 14$t$3, a P-type floating region 16 and an N-type hole barrier region 24$a$ in contact with the P-type floating region 16 are provided. Then, a P-type body region 15 is provided on the P-type floating region 16 and the N-type hole barrier region 24a at the side of the interlayer insulating film 26.

As shown in FIGS. 5 and 6, a P-type body region formed on the P-type floating region 16 of the inactive cell region 40i and a P-type body region formed on the active cell region 40a are connected by the P-type body region 15. A thickness of the P-type body region 15 is made thinner than each of a thickness of the P-type floating region 16 and a thickness of the N-type hole barrier region 24a, so that the resistor against the holes is increased.

A method of manufacturing the semiconductor device 2 will be described with reference to FIGS. 3 and 7 to 11. FIG. 7 to FIG. 11 are cross-sectional views showing a manufacturing process of the semiconductor device shown in FIG. 1. FIGS. 7-11 are cross-sectional views of the same cross-section as the cross-sectional view of FIG. 2.

Figure 7:
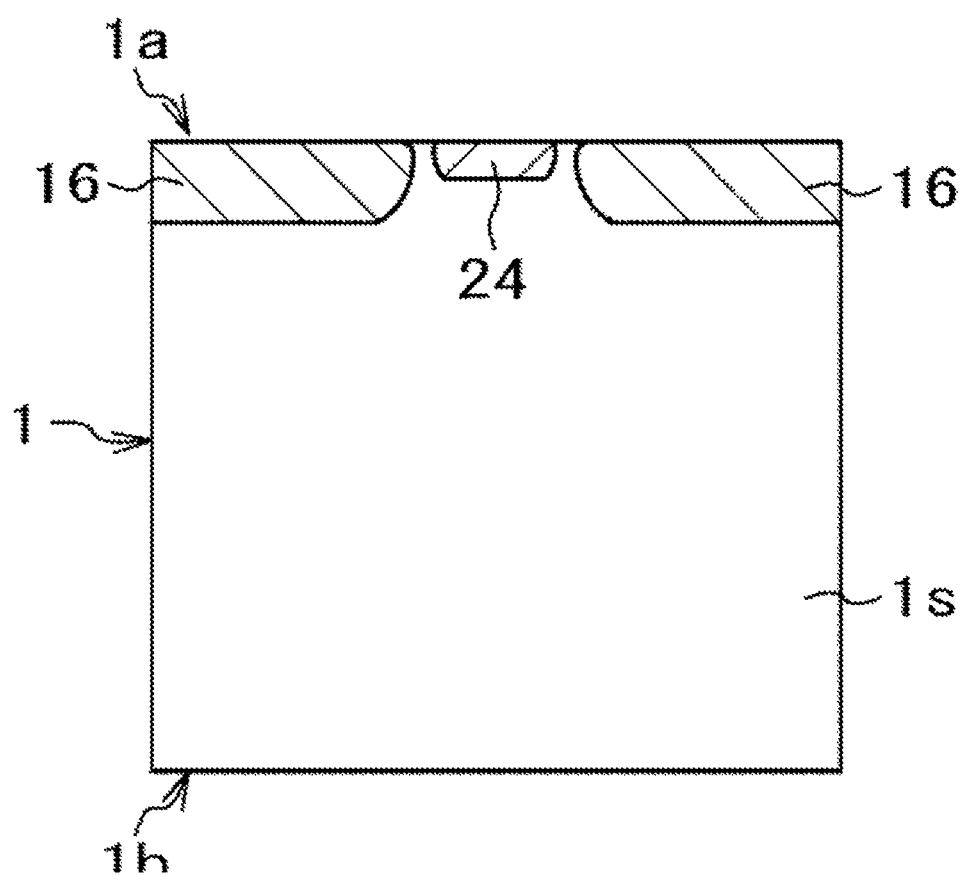
FIG. 7 is a cross-sectional view for explaining the method of manufacturing the semiconductor device shown in FIG. 1.

First, as shown in FIG. 7, a semiconductor wafer 1 made of a single-crystal silicon semiconductor substrate is that an N-type impurity such as phosphorus is introduced is prepared. The semiconductor wafer 1 has an upper surface 1a as a first main surface and a rear surface 1b as a second main surface opposite to the upper surface 1a.

The impurity concentration of the N-type impurity in the semiconductor wafer 1 can be, for example, about $2\times10^{14}$ cm$^{-3}$. The thickness of the semiconductor wafer 1 may be, for example, about 450 μm to 1000 μm.

Next, an N-type hole barrier regions 24 is formed by introducing an N-type impurity into the semiconductor substrate is on the upper surface 1a of the semiconductor wafer 1 by an ion implantation method using a resist pattern as a mask. As the ion implantation conditions at this time, for example, an ion implantation condition in which an ion species is phosphorus, a dose amount is about $6\times10^{12}$ cm$^{-2}$, and an implantation energy is about 200 keV can be exemplified as a suitable condition.

The N-type hole barrier region 24 is formed in the active cell region 40a. The N-type hole barrier region 24a illustrated in FIG. 4 is formed at a boundary between the active cell region 40a and the inactive cell region 40i. The N-type hole barrier region 24a is formed in different region as that of the N-type hole barrier region 24, but is formed in the same process as the N-type hole barrier region 24. Although the N-type hole barrier region 24a is formed by a semiconductor layer formed in the same process as the N-type hole barrier region 24, but the manufacturing process is increased, the N-type hole barrier region 24a may be formed in a separate process from the N-type hole barrier region 24. Here, the N-type hole barrier region 24a can be formed by a semiconductor layer (isolation region) having an N-type impurity concentration such that the P-type floating region 16 and the P-type body region 15 can be substantially separated from each other. Further, although the isolation function is reduced, the N-type hole barrier region 24a can be replaced with N--type drift region 20(1S).

Next, P-type floating regions 16 are formed by introducing a P-type impurity into the semiconductor substrate is on the upper surface 1a of the semiconductor wafer 1 by an ion implantation method using a resist pattern as a mask. As the ion implantation conditions at this time, for example, an ion implantation condition in which ion species is boron, a dose amount is about $3.5\times10^3$ cm 2, and an implantation energy is about 75 keV can be exemplified as a suitable one.

The P-type floating regions 16 are formed in the inactive cell regions 40i. When the P-type floating region 16 are formed in the cell formation region 3, for example, the P-type floating region 16 is also formed in the gate wiring lead-out region 4 (refer to FIG. 2).

Figure 8:
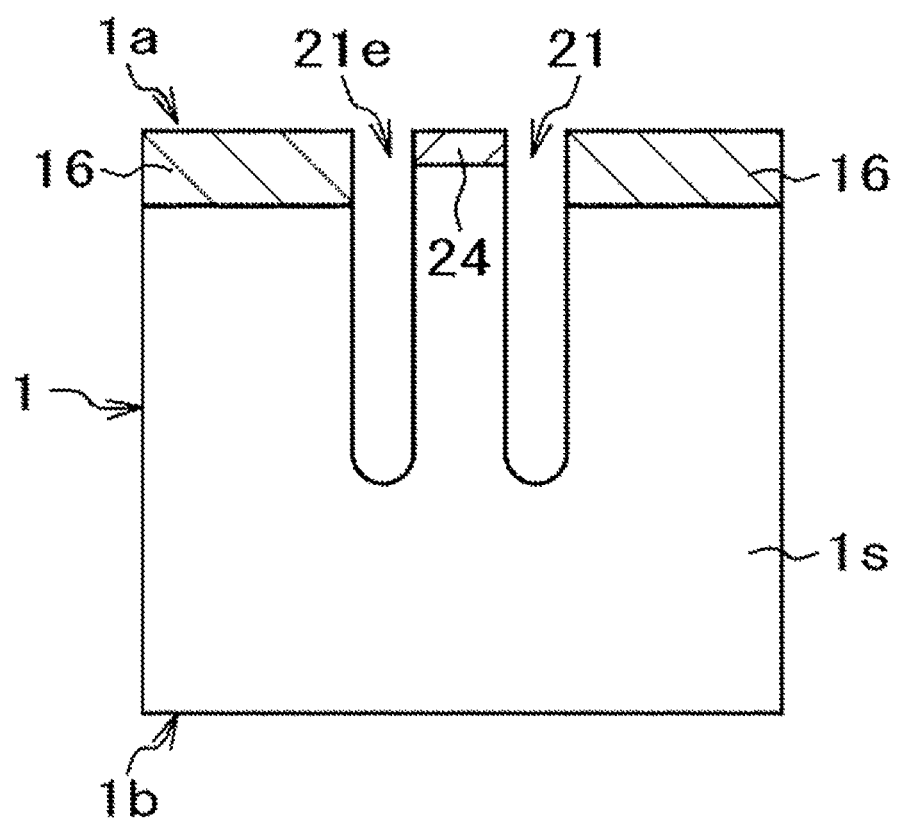
FIG. 8 is a cross-sectional view for explaining a method of manufacturing the semiconductor device shown in FIG. 1.

Next, as shown in FIG. 8, trenches 21 and 21e are formed by, for example, anisotropic dry etching using a hard mask made of, for example, a silicon oxide film. As the anisotropic dry etch gas, for example, $Cl_2/O_2$ gas can be exemplified as a suitable gas.

Figure 9:
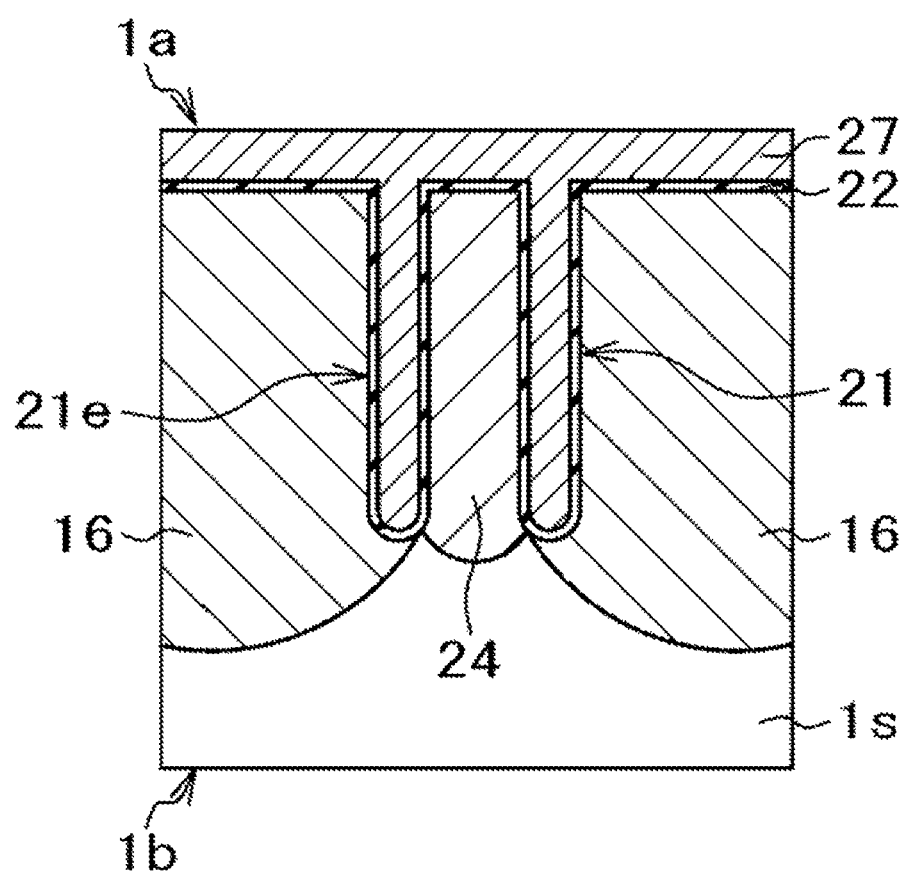
FIG. 9 is a cross-sectional view for explaining a method of manufacturing the semiconductor device shown in FIG. 1.

Next, as shown in FIG. 9, a stretching diffusion (for example, at 1200° C., for about 30 minutes) is performed to the P-type floating regions 16 and the N-type hole barrier region 24. At this time, the P-type floating regions 16 are extended such that end portions of the P-type floating regions 16 at the side of rear surface 1b are disposed at end portions of the trenches 21 and 21e in the Z direction.

Next, a gate insulating film 22 made of, for example, a silicon oxide film is formed on the surface 1a of the semiconductor wafer 1 and on inner walls of each of the trench 21 and 21e by, for example, a thermal oxidation method. The thickness of the gate insulating film 22 is, for example, about 0.12 μm.

The P-type floating regions 16 are formed outside the trenches 21 and the adjacent trench 21e by the stretching diffusion. Preferably, the P-type floating regions 16 contact with the gate insulating film 22 formed on the inner wall of the trench 21 and the gate insulating film 22 formed on the inner wall of the trench 21e.

The N-type hole barrier region 24 is formed between the trench 21 and the trench 21e. Preferably, the N-type hole barrier region 24 formed between the trench 21 and the trench 21e contacts with the gate insulating film 22 formed on the inner wall of the trench 21 and the gate insulating film 22 formed on the inner wall of the trench 21e.

In addition, in the N-type semiconductor wafer 1, a region where the P-type floating region 16 and the N-type hole barrier region 24 are not formed becomes the N--type drift region 20 during the stretching diffusion.

Between the trench 21 and the trench 21e, an N-type impurity concentration of the N-type hole barrier region 24 is higher than that of the N--type drift region 20 and lower than that of the N+-type emitter region 12 described later.

Next, a conductive film 27 formed of a polycrystalline silicon (Doped Poly-Silicon) film doped with phosphorus is formed on the upper surface 1a of the semiconductor wafer 1 and inside the trench 21 and 21e by, for example, CVD (Chemical Vapor Deposition) method. A thickness of the conductive film 27 is, for example, about 0.5 μm to 1.5 μm.

Figure 10:
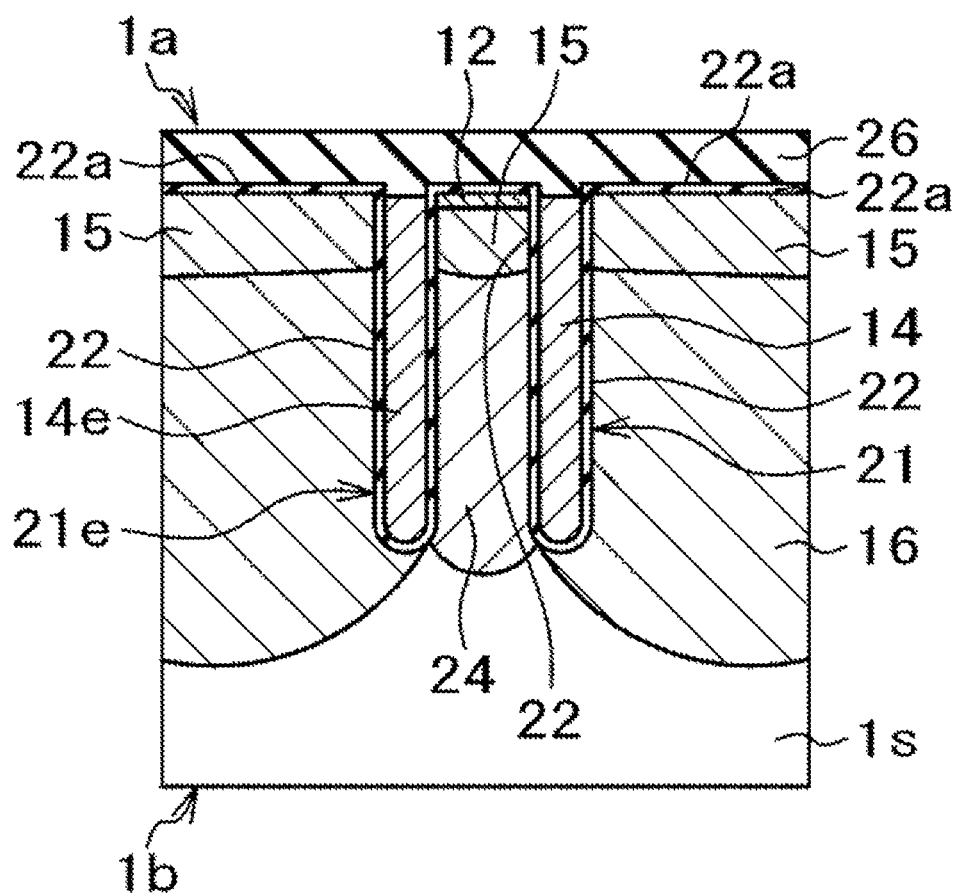
FIG. 10 is a cross-sectional view for explaining a method of manufacturing the semiconductor device shown in FIG. 1.

Next, as shown in FIG. 10, the conductive film 27 is etched back by, for example, a dry etching method. As a result, a trench gate electrode 14 made of the conductive film 27 buried in the trench 21 via the gate insulating film 22 interposed therebetween is formed. In addition, a trench emitter electrode 14e made of the conductive film 27 buried in the trench 21e via the gate insulating film 22 interposed therebetween is also formed. As an etching gas, for example, $SF_6$ gas or the like can be exemplified as a suitable gas.

Next, a portion of the gate insulating film 22 other than the inside of the trench 21 and 21e are removed by, for example, a dry etching method.

Next, an insulating film 22a made of a relatively thin silicon oxide film for subsequent ion implantation is formed on the surface 1a of the semiconductor wafer 1 by, for example, a thermal oxidation method or a CVD method. The insulating film 22a is formed to have a thickness of, for example, about several nm~20 nm, and is used as a through film for ion implantation, and is also referred to as an ion implantation through insulating film.

Next, P-type body regions 15 are formed by introducing a P-type impurity into the entire surface of the cell formation region 3 and other necessary portions by an ion implantation method using a resist pattern as a mask.

Specifically, between the trench 21 and the trench 21e, a P-type body area 15 is formed so as to contact the gate insulating film 22 that is formed on the inner wall of the trench 21 and the inner wall of the trench 21e. The P-type body region 15 is formed on the N-type hole barrier region 24. In the inactive cell region 40i, the P-type body region 15 is formed on the P-type floating region 16. The P-type body region 15 is formed on the N-type hole barrier region 24a.

As the ion implantation conditions at this time, for example, an ion implantation condition in which an ion species is boron, the dose amount is about $3 \times 10^{13}$ cm$^{-2}$, and the implantation energy is about 75 keV can be exemplified as a suitable condition. Although the P-type body region 15 formed on the N-type hole barrier region 24a in in the inactive cell region 40i is formed of a semiconductor layer in the same process as the P-type body region 15 formed in the active cell region 40a, the manufacturing process is increased, but the P-type body region 15 in the inactive cell region 40i may be formed in a separate process from the P-type body region 15 formed in the active cell region 40a. In this case, as an alternative to the P-type body region 15 formed on the N-type hole barrier region 24a, a semiconductor region having a P-type impurity concentration such that the above-described drain region of the parasitic NMOS is not formed can be used.

Further, an N+-type emitter region 12 is formed by introducing an N-type impurity into an upper layer portion of the P-type body region 15 in the active cell region 40a by an ion implantation method using the resist pattern as a mask.

As the ion implantation conditions at this time, for example, an ion implantation condition in which an ion species is arsenic, the dose amount is about $5 \times 10^{15}$ cm$^{-2}$, and the implantation energy is about 80 keV can be exemplified as a suitable condition.

Next, as shown in FIG. 10, an interlayer insulating film 26 made of, for example, a PSG film is formed on the upper surface 1a of the semiconductor wafer 1 by, for example, a CVD method. The interlayer insulating film 26 is formed in each of the active cell region 40a and the inactive cell region 40i so as to cover the P-type body region 15 via the insulating film 22a, for example. The thickness of the interlayer insulating film 26 is, for example, about 0.6 μm. As the material of the interlayer insulating film 26, in addition to PSG film, BPSG(Boro-Phospho-Silicate Glass) film, NSG(Non-doped Silicate Glass) film, SOG(Spin-On-Glass) film, or a composite film thereof can be exemplified as a suitable one.

Figure 11:
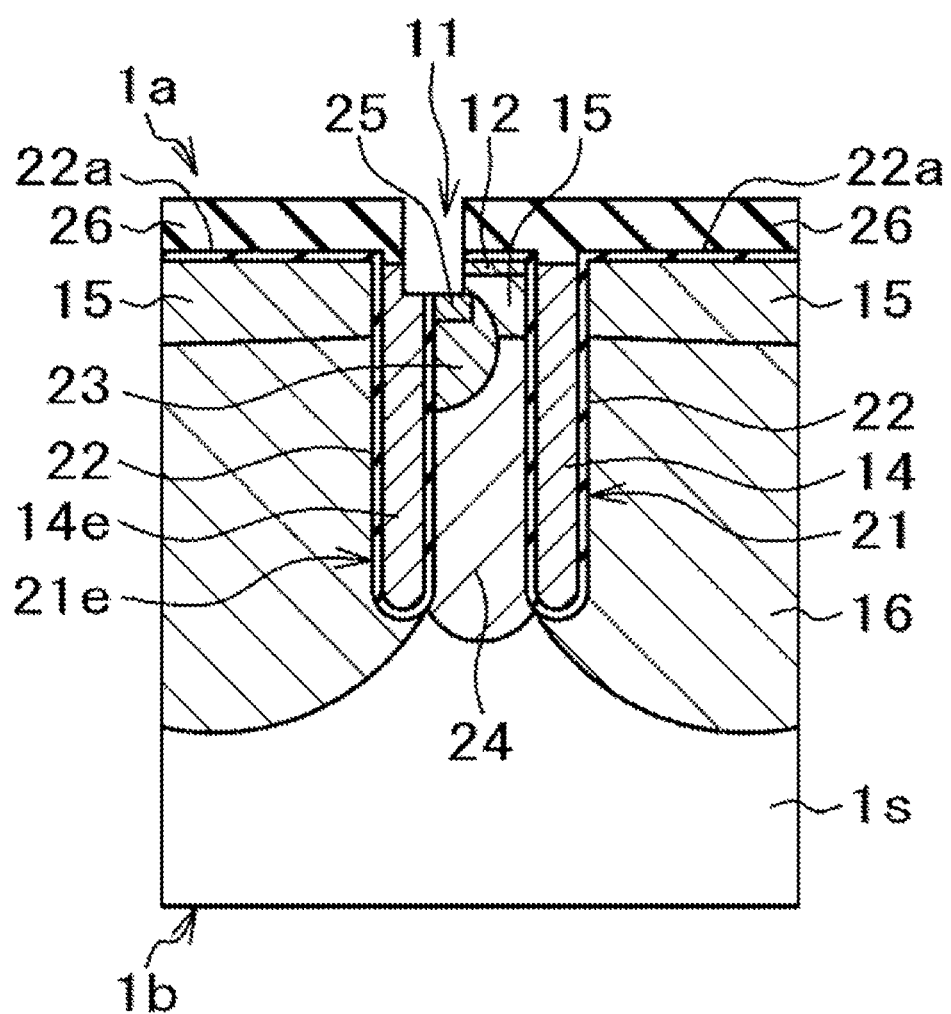
FIG. 11 is a cross-sectional view for explaining a method of manufacturing the semiconductor device shown in FIG. 1.

Next, as shown in FIG. 11, a contact groove 11 is formed in the interlayer insulating film 26 by anisotropic dry etching using a resist pattern as a mask. As a gas for the anisotropic dry etching, for example, a mixed gas composed of Ar gas, CHF 3 gas, and CF$_4$ gas can be exemplified as a suitable gas. Subsequently, the contact groove 11 is extended into the semiconductor wafer 1 by an anisotropic dry etching method. As a result, in the active cell region 40a, and the contact groove 11 penetrates the interlayer insulating film 26, and is formed as an opening reaching the middle of the P-type body region 15 and the trench 21e. In the active cell area 40a, the contact groove 11 is formed continuously along the Y direction in a plan view. As the anisotropic dry etching gas, for example, Cl$_2$/O$_2$ gas can be exemplified as a suitable gas.

Next, a P+-type body contact region 25 is formed by, for example, an ion implantation method of a P-type impurity through the contact groove 11. As the ion implantation conditions at this time, for example, the ion species is boron, the dose amount is about $5 \times 10^{15}$ cm$^{-2}$, and the implantation energy is about 80 keV can be exemplified as a suitable condition. When the P+-type body contact region 25 is formed in the cell formation region 3, for example, the P+-type body contact region 25p is formed in the gate wiring lead-out region 4 (refer to FIG. 2).

Next, a P+-type latch-up prevention region 23 is formed by, for example, an ion implantation method of a P-type impurity through the contact groove 11. As the ion implantation conditions at this time, for example, the ion species is boron, the dose amount is about $1 \times 10^{15}$ cm$^{-2}$, and the implantation energy is about 100 keV can be exemplified as a suitable condition. A P-type impurity concentration of the P+-type body contact region 25 is higher than that of the P+-type latch-up prevention region 23.

In the active cell region 40a, the P+-type body contact region 25 and the P+-type latch-up prevention region 23 are formed in a part of the P-type body region 15 exposed in the contact trench 11. In the active cell region 40a, the P+-type body contact region 25 and the P+-type latch-up prevention region 23 are continuously formed along the Y direction in a plan view.

That is, the P+-type body contact region 25 and the P+-type latch-up prevention region 23 that are in contact with the P-type body region 15 are formed in a portion located between the trench 21 and the trench 21e. In the active cell region 40a, A P-type impurity concentration in each of the P+-type body contact region 25 and the P+-type latch-up prevention region 23 is higher than that of the P-type body region 15.

Next, as shown in FIG. 3, an emitter electrode 8 is formed. Specifically, for example, the processing for the emitter electrode 8 is performed by the following procedure. First, a titanium tungsten film is formed as a barrier metal film on the upper surface 1a of the semiconductor wafer 1 by, for example, a sputtering method. A thickness of the titanium tungsten film is, for example, about 0.2 μm.

Next, for example, a silicide annealing at about 600° C. for about 10 minutes is performed in a nitrogen atmosphere. Thereafter, an aluminum-based metal film (for example, a few percent silicon additive, the remainder aluminum) is formed by, for example, a sputtering method so as to fill the contact groove 11 on the entire surface of the barrier metal film. A thickness of the aluminum-based metal film is, for example, about 5 μm.

Next, the emitter electrode 8 made of the aluminum-based metal film and the barrier metal film is formed by a dry etching method using a resist pattern as a mask. As a dry-etching gas, for example, Cl$_2$/BCl$_3$ gas or the like can be exemplified as a suitable gas.

As a result, in the active cell area 40a, the emitter-electrode 8 are formed on the inside of the contact trench 11 and on the interlayer insulating film 26.

The emitter electrode 8 is electrically connected to the plurality of N+-type emitter regions 12, the plurality of P+-type body contact regions 25, and the P+-type latch-up prevention region 23 formed in the active cell region 40a.

When the emitter electrode 8 is formed, the gate electrode 6 electrically connected to the trench gate electrode 14 may be formed (see FIG. 1). When the emitter electrode 8 is formed in the cell formation region 3, the gate wiring 5 and the gate electrode 6 may be formed in the gate wiring lead-out region 4 (refer to FIG. 1).

Next, an insulating film 28 as a passivation film made of, for example, an organic film containing polyimide as a main component is formed on the emitter electrode 8. A thickness of the insulating film 28 is, for example, about 2.5 μm.

Next, the insulating film 28 is patterned by a dry etching method using a resist pattern as a mask to form an opening 28e that penetrates through the insulating film 28 and reaches the emitter electrode 8 (see FIG. 1). Then, the emitter pad 9 is formed by a part of the emitter electrodes 8 exposed from the opening 28e (refer to FIG. 1).

When the insulating film 28 is formed on the emitter electrode 8 in the cell formation region 3, the insulating film 28 is also formed on the gate electrode 6 in the gate wiring lead-out region 4 (refer to FIG. 1). When the opening 28e is formed in the cell forming region 3, an opening 28g that penetrates the insulating film 28 and reaches the gate electrode 6 is formed in the gate wire lead-out region 4. Then, a gate pad 7 is formed of a part of the gate electrode 6 exposed from the opening 28g (see FIG. 1).

Next, the rear surface 1b of the semiconductor wafer 1 is subjected to a back grinding process, whereby a thickness of, for example, about 800 μm is thinned to, for example, about 30 μm to 200 μm as needed. For example, when a breakdown voltage of the semiconductor device needs about 600V, the final thickness of the semiconductor wafer 1 is about 70 μm. In addition, a chemical etching or the like for removing damage to the rear surface 1b is also performed as needed.

Next, an N-type field stop region 19 is formed by introducing N-type impurities into the rear surface 1b of the semiconductor wafer 1 by, for example, an ion implantation method. As the ion implantation conditions at this time, for example, the ion species is phosphorus, the dose amount is about $7 \times 10^{12}$ cm$^{-2}$, and the implantation energy is about 350 keV can be exemplified as a suitable condition. Thereafter, laser annealing or the like is performed on the rear surface 1b of the semiconductor wafer 1 to activate a layer introduced the impurities as needed.

Next, a P+-type collector regions 18 is formed by introducing a P-type impurity into the rear surface 1b of the semiconductor wafer 1 by, for example, an ion implantation method. As the ion implantation conditions at this time, for example, the ion species is boron, the dose amount is about $1 \times 10^{13}$ cm$^{-2}$, and the implantation energy is about 40 keV can be exemplified as a suitable condition. Thereafter, laser annealing or the like is performed on the rear surface 1b of the semiconductor wafer 1 to activate a layer introduced the impurities as needed.

Next, a collector electrode 17 electrically connected to the P+-type collector region 18 is formed on the rear surface 1b of the semiconductor wafer 1 by, for example, a sputtering method. Thereafter, the semiconductor wafer 1 is divided into chip regions by dicing or the like, and sealed in a package as needed, thereby substantially completing the semiconductor device 2.

Here, in order to more specifically exemplify the device structure, an example of the main dimensions of each part of the device (refer to FIGS. 2 and 3) is shown. That is, the width (Ws) of the active cell region is about 0.8 μm to 0.9 μm, and the width (Wi) of the inactive cell region is about 3.3 μm. The width (Ws) of the active cell region is preferably narrower than the width (Wi) of the inactive cell region, and Wi/Ws is particularly preferably in the range of 2 to 3, for example. The contact width is about 0.3 μm, the trench width is about 0.4 μm to 0.5 μm, and the trench depth is about 3 μm. The depth of the N+-type emitter region 12 is about 250 nm, the depth of the P-type body region 15 (channel region) is about 0.8 μm, and the depth of the P+-type latch-up prevention region 23 is about 1.4 μm. The depth of the P-type floating region 16 is about 4.5 μm, the thickness of the N-type field stop region 19 is about 1.5 μm, the thickness of the P+-type collector region is about 0.5 μm, and the thickness of the semiconductor-substrate 1s is about 70 μm. Here, the thickness of the semiconductor substrate is shows an exemplary breakdown voltage of about 600 volts. The thickness of the semiconductor-substrate is strongly depends on the required breakdown voltage. Therefore, the withstand voltage of 1200 volts is, for example, about 120 μm, and the withstand voltage of 400 volts is, for example, about 40 μm. Note that these numerical values are merely examples.

Figure 12:
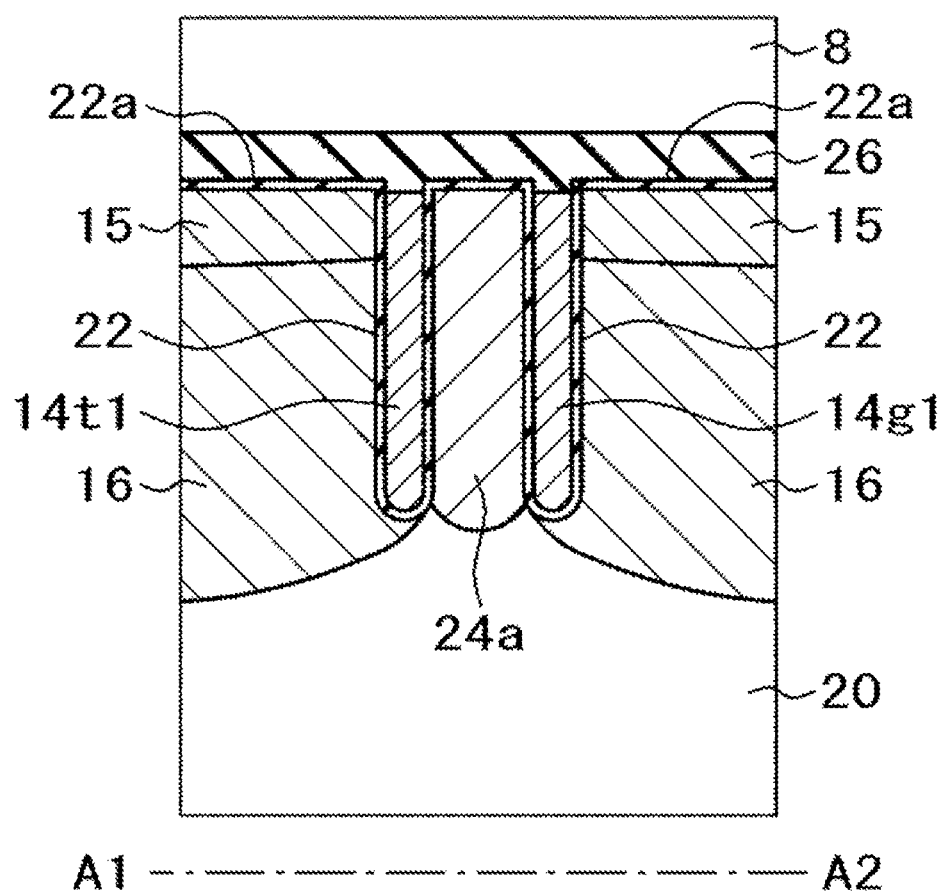
FIG. 12 is a cross-sectional view of a semiconductor device according to a comparative embodiment, which is corresponding to the A1-A2 line cross-sectional view of the semiconductor device shown in FIG. 2.
Figure 13:
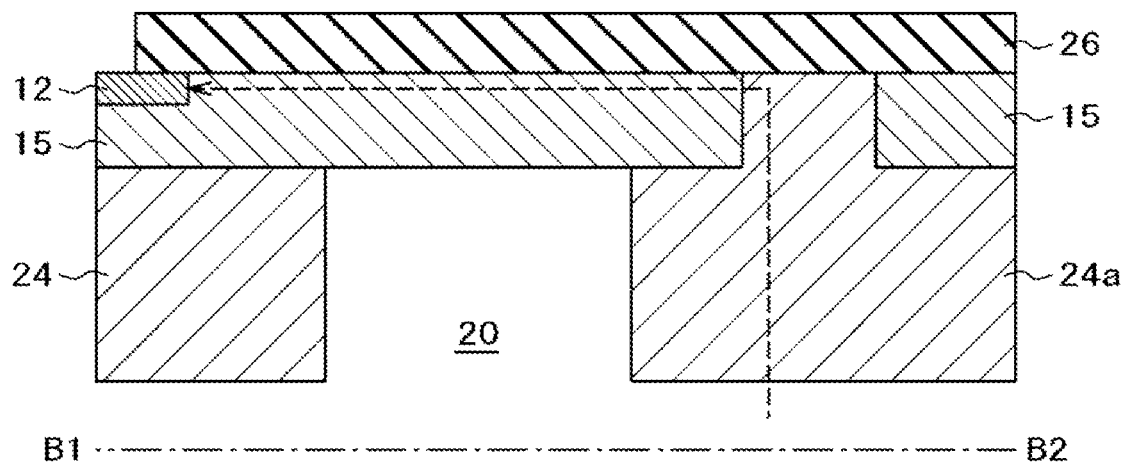
FIG. 13 is a cross-sectional view of a semiconductor device according to a comparative embodiment, which is corresponding to the B1-B2 line cross-sectional view of the semiconductor device shown in FIG. 2.
Figure 14:
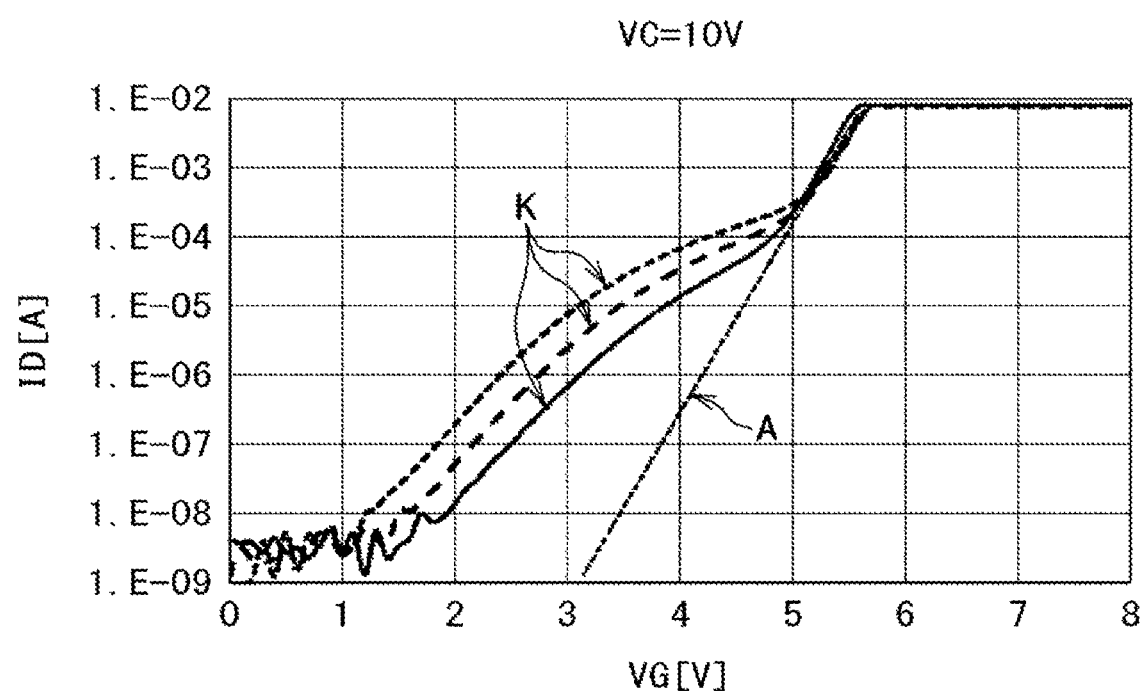
FIG. 14 is a diagram illustrating ID-VG property in which kinking occurs by study of the present Inventors.

The effects of the present embodiment will be described with reference to FIGS. 12 to 14. FIG. 12 is a cross-sectional view of a semiconductor device according to a comparative embodiment and is corresponding to A1-A2 line of the semiconductor device shown in FIG. 2. FIG. 13 is a cross-sectional view of a semiconductor device according to the comparative embodiment and is corresponding to B1-B2 line of the semiconductor device shown in FIG. 2. FIG. 14 is a diagram illustrating ID-VG property in which kinking occurs.

As shown in FIG. 12, in the semiconductor device of the comparative example, the hole barrier region 24a between the end trench gate electrode 14g1 and the end trench emitter electrode 14t1 is formed by the same high-concentration N-type layer as the N-type hole barrier region 24. The high-concentration N-type layers are formed by masking with a resist pattern so that P-type impurities are not introduced between the end trench gate electrode 14g1 and the end trench emitter electrode 14t1 when the P-type body regions 15 are formed by the ion implantation method. As a result, a resistance to the holes increases and the hole barrier effect is obtained in the lateral direction (X direction), and the P-type floating regions 16 are separated.

However, in the structure of the semiconductor device in the comparative example, as shown in FIG. 13, a parasitic NMOS is formed. The parasitic NMOS is composed of the emitter region 12 on the P-type body region 15 as a source region, and the hole barrier region 24a of a high concentration N-type layer as a drain region. When an insulating film containing phosphorus, such as a PSG film, is used as the interlayer insulating film 26 formed between the P-type body region 15 and the emitter electrode 8, phosphorus, which is an N-type impurity, may seep out on the P-type body region 15. Although there is an insulating film 22a between the interlayer insulating film 26 and the P-type body region 15, since the insulating film 22a is thin (on the order of several nm~20 nm), in particular, the shoulder portion of the trench gate electrode 14 has a thin insulating film 22a, so that phosphorus leaches out into the P-type body region 15. Therefore, the effective channel impurity concentration of the parasitic NMOS decreases, and the parasitic NMOS conducts (ON state), so that a current path indicated by a broken line arrow is formed in the emitter region 12, the P-type body region 15, the high-concentration N-type layer, and the semiconductor substrate 20. Consequently, a current flows at voltages where the gate voltage (VG) is lower than the thresholds.

Figure 15:
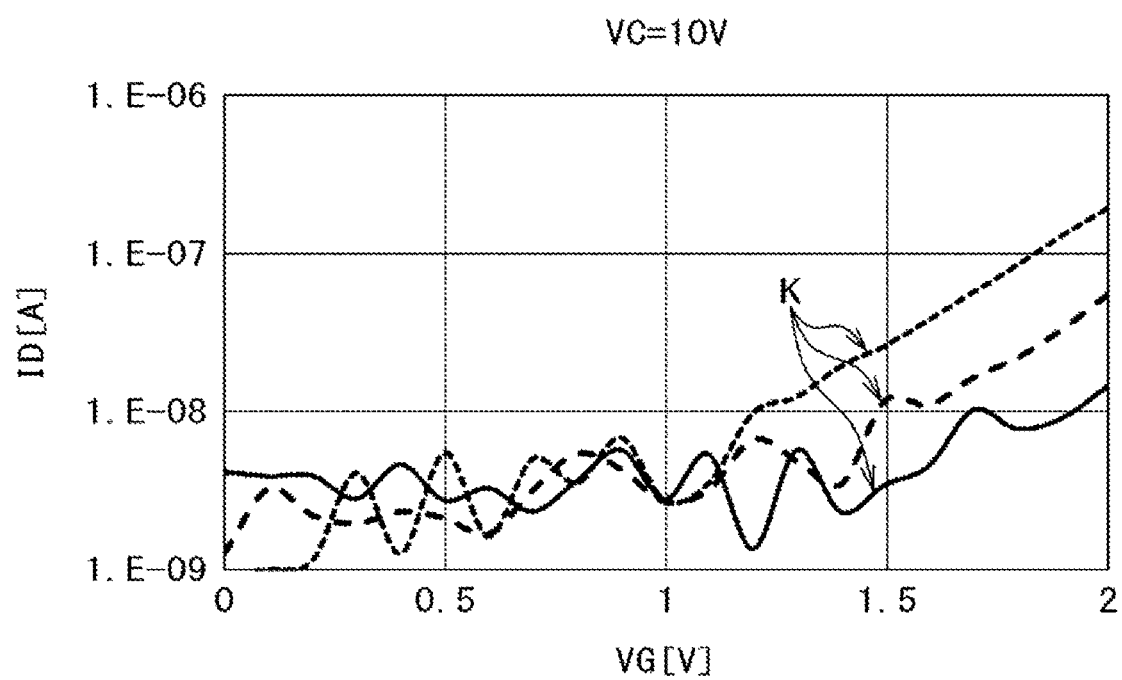
FIG. 15 is a partially enlarged view of FIG. 14.

A normal current path is a path from the semiconductor substrate 1s (N--type drift region 20) to the emitter-electrode 8 via the N-type hole barrier region 24, the P-type body region 15, and the emitter region 12. Since an appropriate Vth is secured by the P-type body area 15, the current (ID) rises steeply linearly at a certain gate voltage (VG) as indicated by an arrow A in FIG. 14. When a current flows in a parasitic NMOS other than the normal path, a kink is generated in ID-VG property as indicated by arrows K in FIG. 14. Here, the kink is a phenomenon in the ID-VG characteristics in which a low-threshold transistor such as the parasitic NMOS is turned on first, so that the waveform does not become linear and the waveform appears to have two or more stages. Note that the arrows K in FIG. 14 indicate the occurrence state of the kink by three lines (a short dotted line, a long dotted line, and a solid line) as exemplary experimental data. FIG. 15 shows an enlarged view of a region in which the gate-voltage (VG) shown in FIG. 14 is 0 to 2V.

In the present embodiment, the P-type body region 15 formed on the P-type floating region 16 of the inactive cell region 40i and the P-type body region 15 formed in the active cell region 40a are not electrically completely separated by the hole barrier region 24a. That is, in the present embodiment, as shown in FIGS. 6 and 7, the P-type body regions 15 formed both in the inactive cell region 40i and the active cell region 40a are connected by the P-type body region 15 having a high resistance against the holes. Thus, since the parasitic NMOS is not formed, it is possible to suppress generation of a kink waveform in ID-VG property. In addition, the high resistance P-type body region 15 can reduce the withdrawal of holes from the P-type floating region 16, so that IE effect can be maintained and a low VCE(sat) can be maintained.

Representative modification examples will be described below. In the following description of the modified example, the same reference numerals as in the above-described embodiment may be used for portions having the same configurations and functions as those described in the above-described embodiment. The description of the above-described embodiments can be appropriately incorporated within the scope of technical inconsistencies. In addition, some or all of the above-described embodiments and all or some of the modification examples may be applied in a combined manner as appropriate within a range not technically contradicting.

In the embodiment, the structure in which the parasitic NMOS is not formed has been described, the structure in which the parasitic MOS shown in FIGS. 12 and 13 is formed, the interlayer insulating film 26 may be PSG/NSG stacked so as to suppress the leaching of phosphorus. NSG film preferably has, for example, a thickness of about 100 nm.

Thus, conduction of the parasitic NMOS can be suppressed. In addition, since the P-type floating region 16 and the P+-type body contact region 25 can be electrically completely separated from each other, VCE(sat) can be lower than in the embodiment.

In the embodiment, the P-type floating region 16 and the P+-type body contact region 25 are not completely electrically isolated from each other. However, when the area of the P-type floating region 16 per unit cell is large, even if a hole is slightly pulled out from the cell end portion, the effect is extremely small in the entire chip. On the other hand, in a case where the area of the P-type floating region 16 per unit cell is small, if a hole is slightly pulled out from the cell end portion, the effect becomes large in the entire chip. For example, in a IGBT incorporating a IGBT for sensing, the IGBT for sensing is about 1/1000 of the size of the chip. Therefore, there is a concern that the sensing IGBT may have a large effect on the hole being slightly extracted from the cell end portion. When it is necessary to take such measures, this modification is effective.

While the present disclosure made by the inventors has been specifically described based on the embodiments and modifications, the present disclosure is not limited to the above-described embodiments and modifications, and it is needless to say that the present disclosure can be variously modified without departing from the gist thereof.

What is claimed is:

1. A semiconductor device comprising:
   a semiconductor substrate having a first main surface and a second main surface opposite to the first main surface;
   a drift region of a first conductivity type formed in the semiconductor substrate; and
   a cell region formed on the first main surface of the semiconductor substrate,
   the cell region includes:
   an active cell region provided in the semiconductor substrate from the first main surface toward the drift region,
   a trench gate electrode and a trench emitter electrode formed in a pair of trenches which is formed on a surface of the first main surface so as to extend in a first direction and sandwich the active cell region in a plan view,
   a body region of a second conductivity type opposite to the first conductivity type formed in a surface region of the drift region at a side of the first main surface,
   an inactive cell region provided in the semiconductor substrate at both sides of the active cell region so as to sandwich the active cell region and adjacent the trench gate electrode and the trench emitter electrode in a plan view,
   an emitter region of the first conductivity type provided in the active cell region and formed in a surface region of the body region at the side of the first main surface;
   a contact hole in contact with the trench emitter electrode, the emitter region and the body region;
   a first hole barrier region of the first conductivity type which is formed in the drift region under the body region in the active cell region and has an impurity concentration higher than that of the drift region and lower than that of the emitter region;
   a floating region of the second conductivity type formed under the body region in the inactive cell region;
   an end trench gate electrode connected to one end of the trench gate electrode and extending in a second direction different from the first direction in a plan view and formed in the surface of the first main surface; and
   an end trench emitter electrode connected to one end of the trench emitter electrode and extending in the second direction in a plan view and formed in the surface region on the first main surface in the inactive cell region,
   wherein a second hole barrier region of the first conductivity type formed in the drift region under the body region between the end trench gate electrode and the end trench emitter electrode in a plan view and having an impurity concentration higher than that of the drift region and lower than that of the emitter region, and
   wherein the body region in the active cell region and the body region in the inactive cell region are connected by the body region between the end trench gate electrode and the end trench emitter electrode.

2. A semiconductor device according to claim 1, further comprising a second end trench emitter electrode and a third end trench emitter electrode in a trench provided in the surface region on the first main surface in the inactive cell region, wherein the other end of the end trench emitter electrode is connected to one end of the third end trench emitter electrode, wherein the third end trench emitter electrode extends in the first direction in a plan view and the other end of the third end trench emitter electrode is connected to one end of the second end trench emitter electrode, wherein the second end trench emitter electrode extends in the second direction in a plan view and the other end of the second end trench emitter electrode is connected to the trench emitter electrode.

3. A semiconductor device according to claim 2, further comprising a second trench gate electrode in a trench adjacent to the inactive cell region and provided in the surface region of the first main surface and extending in the first direction in a plan view, wherein the second hole barrier region is extended at a lower portion of the body region and an upper portion of the drift region in a region between the second trench gate electrode and the third end trench emitter electrode, and wherein the floating region is extended at the lower portion of the body region and the upper portion of the drift region and is adjacent to the second hole barrier region.

4. A semiconductor device according to claim 1, wherein the second hole barrier region is spaced apart from the first hole barrier region by the drift region.

5. A semiconductor device comprising:
a semiconductor substrate having a first main surface and a second main surface opposite to the first main surface;
a drift region of a first conductivity type formed in the semiconductor substrate; and
a cell region formed on the first main surface of the semiconductor substrate,
the cell region includes:
an active cell region provided in the semiconductor substrate from the first main surface toward the drift region,
a trench gate electrode and a trench emitter electrode formed in a pair of trenches which is formed on a surface of the first main surface so as to extend in a first direction and sandwich the active cell region in a plan view,
a body region of a second conductivity type opposite to the first conductivity type formed in a surface region of the drift region at a side of the first main surface,
an inactive cell region provided in the semiconductor substrate at both sides of the active cell region so as to sandwich the active cell region and adjacent the trench gate electrode and the trench emitter electrode in a plan view,
an emitter region of the first conductivity type provided in the active cell region and formed in a surface region of the body region at the side of the first main surface;
a contact hole in contact with the trench emitter electrode, the emitter region and the body region;
a first hole barrier region of the first conductivity type which is formed in the drift region under the body region in the active cell region and has an impurity concentration higher than that of the drift region and lower than that of the emitter region;
a floating region of the second conductivity type formed under the body region in the inactive cell region;
an end trench gate electrode connected to one end of the trench gate electrode and extending in a second direction different from the first direction in a plan view and formed in the surface of the first main surface; and
an end trench emitter electrode connected to one end of the trench emitter electrode and extending in the second direction in a plan view and formed in the surface region on the first main surface in the inactive cell region, wherein an isolation region of the first conductivity type for separating the body region and the floating region is provided between the end trench gate electrode and the end trench emitter electrode in a plan view, and wherein a semiconductor region of the second conductivity type is further provided in a surface region of the isolation region so as to connect the body region and the floating region.

6. A semiconductor device according to claim 5, wherein the semiconductor region of the second conductivity type is formed of a semiconductor layer that is the same layer as the body region.

7. A semiconductor device according to claim 6, wherein the isolation region of the first conductivity type is formed of a semiconductor layer that is the same layer as the first hole barrier region of the first conductivity type.

8. A method of manufacturing a semiconductor device having:
a trench emitter electrode extending in a first direction in a plan view and located at a boundary between one end of an active cell region and a first inactive cell region;
a trench gate electrode extending in the first direction in a plan view and located at a boundary between the other end of the active cell region and a second inactive cell region;
an end trench gate electrode connected to one end of the trench gate electrode and extending in a second direction different from the first direction in a plan view; and
an end trench emitter electrode connected to one end of the trench emitter electrode in the first inactive cell region and extending in the second direction in a plan view,
the method comprising the steps of:
defining a first region and a second region adjacent to each other in a semiconductor substrate of a first conductivity type having a first surface;
forming the trench gate electrode and the end trench gate electrode in a first trench reaching a first depth from the first surface of the semiconductor substrate in the first region, via a first insulating film;
forming the trench emitter electrode and the end trench emitter electrode in a second trench reaching the first depth from the first surface of the semiconductor substrate in the first region, via a second insulating film, the second trench is spaced apart from the first trench;
forming a hole barrier region by introducing an impurity of a first conductivity type into the semiconductor substrate located in the first region;
forming a floating region by introducing an impurity of a second conductivity type into the semiconductor substrate located in the second region;
forming a first semiconductor region of the first conductivity type from the first surface to a second depth of the semiconductor substrate located in the first region between the trench gate electrode and the trench emitter electrode;
forming a second semiconductor region of the second conductivity type in the semiconductor substrate that is positioned in the first region between the trench gate electrode and the trench emitter electrode and in the second region between the end trench gate electrode and the end trench emitter electrode such that the second semiconductor region being deeper than the second depth and shallower than the first depth;

forming an opening in the trench emitter electrode, the first semiconductor region and the second semiconductor region; and forming a contact portion electrically connected to the trench emitter electrode, the first semiconductor region and the second semiconductor region in the opening.

* * * * *